United States Patent
Sasaki

Patent Number: 5,817,556
Date of Patent: Oct. 6, 1998

[54] METHOD OF MANUFACTURING A SEMICONDUCTOR MEMORY DEVICE INCLUDING MEMORY CELLS HAVING CONNECTED SOURCE REGIONS

[75] Inventor: Hiroyuki Sasaki, Kanagawa-ken, Japan

[73] Assignee: Kabushiki Kaisha Toshiba, Kawasaki, Japan

[21] Appl. No.: 536,173

[22] Filed: Sep. 29, 1995

[30] Foreign Application Priority Data

Sep. 30, 1994 [JP] Japan .................................. 6-238084

[51] Int. Cl.$^6$ ...................................... H01L 21/336
[52] U.S. Cl. ......................... 438/257; 438/263; 438/265
[58] Field of Search ................................. 257/316, 315, 257/333; 437/48; 438/257, 263, 265

[56] References Cited

U.S. PATENT DOCUMENTS 5,110,753   5/1992   Gill et al. ............................... 227/316

FOREIGN PATENT DOCUMENTS

56-45068   4/1981   Japan .

Primary Examiner—Carl W. Whitehead
Attorney, Agent, or Firm—Banner & Witcoff, Ltd.

[57] ABSTRACT

A method of manufacturing a semiconductor memory device having a plurality of memory cells arranged in matrix includes forming a first masking layer on a semiconductor substrate of a first conductivity type and patterning the first masking layer to form a plurality of parallel strips which extend in first direction. A second masking layer is formed on the patterned first masking layer and the second masking layer is patterned to form a plurality of parallel strips which extend in a second direction perpendicular to the first direction. First impurities of a second conductivity type are implanted into the semiconductor substrate, using the patterned first and second masking layers as a mask, to form impurity regions of the second conductivity type. The patterned second masking layer is then removed and an insulating film is formed in the spaces between the parallel strips of the patterned first masking layer for isolating element regions on the semiconductor substrate. The insulating film covers the impurity regions of the second conductivity type. The patterned first masking layer is then removed and a conductive layer is patterned to form control gates for the memory cells in the element regions on the semiconductor substrate. Second impurities of the second conductivity type are implanted into the semiconductor substrate using the control gates as a mask to form self-aligned source regions for the memory cells, wherein the source region of a first memory cell is connected to the source region of a second memory cell by one of the impurity regions of the second conductivity type.

6 Claims, 9 Drawing Sheets

METHOD OF MANUFACTURING A SEMICONDUCTOR MEMORY DEVICE INCLUDING MEMORY CELLS HAVING CONNECTED SOURCE REGIONS

BACKGROUND OF THE INVENTION

1. Technical Field

The present invention generally relates to a semiconductor memory device and a manufacturing method thereof and, more particularly, to a semiconductor memory device and a manufacturing method thereof that are suited to a Flash EEPROM.

2. Description of Related Art

Figure 1:
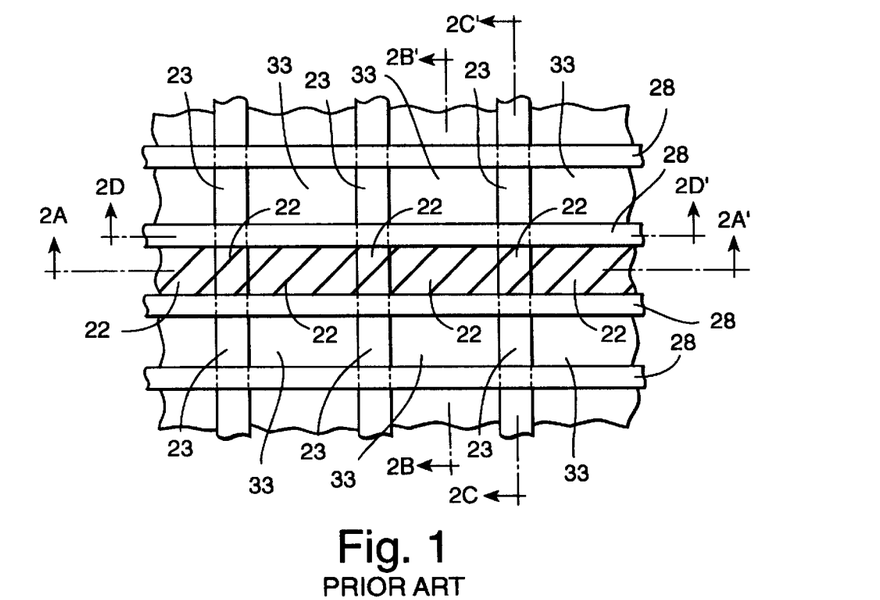
FIG. 1 is a plan view of a portion of a conventional EEPROM.
Figure 2A:
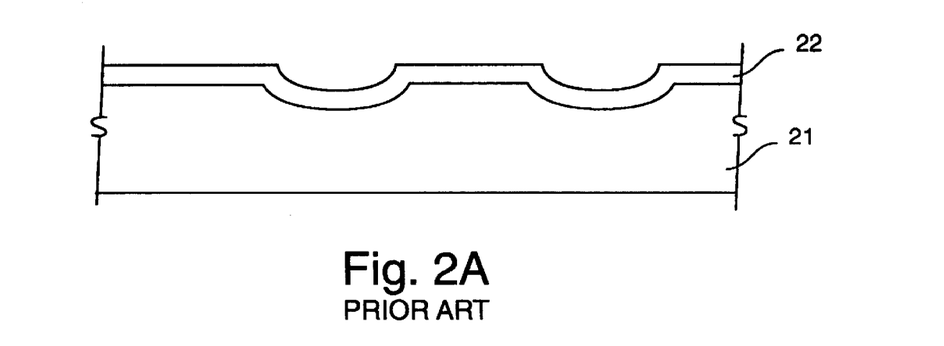
FIG. 2A is sectional view taken along line 2A–2A' of FIG. 1.
Figure 2B:
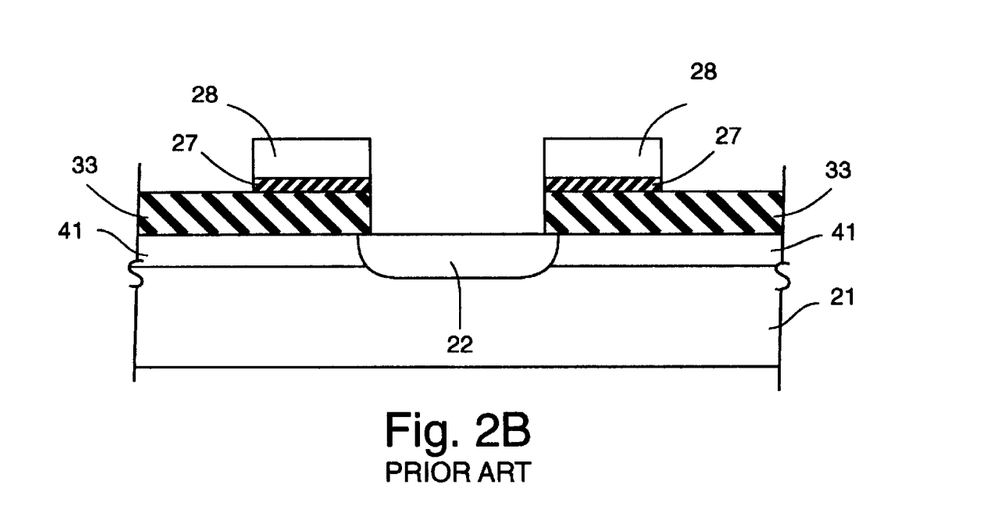
FIG. 2B is a sectional view taken along line 2B–2B' of FIG. 1.
Figure 2C:
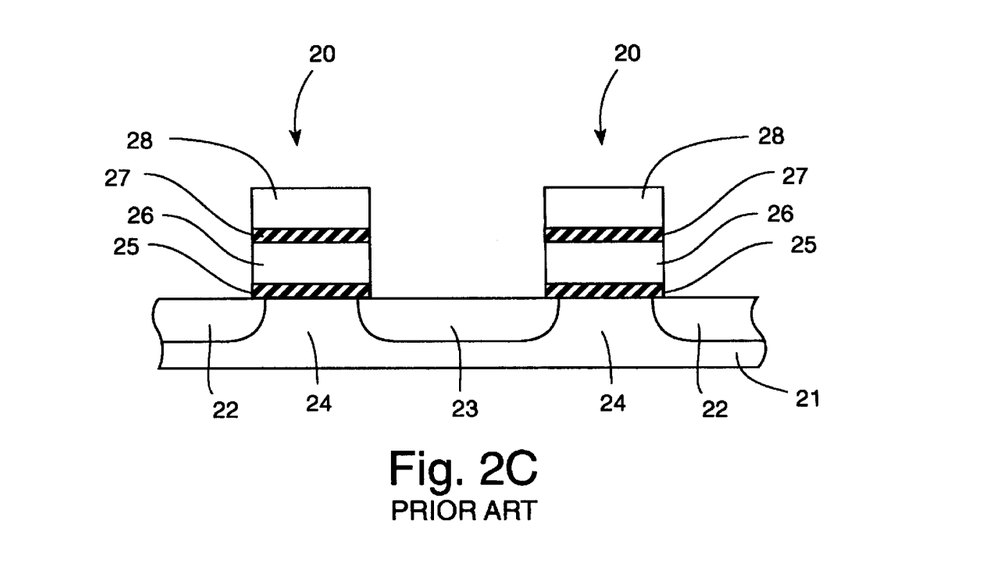
FIG. 2C is a sectional view taken along line 2C–2C' of FIG. 1.
Figure 2D:
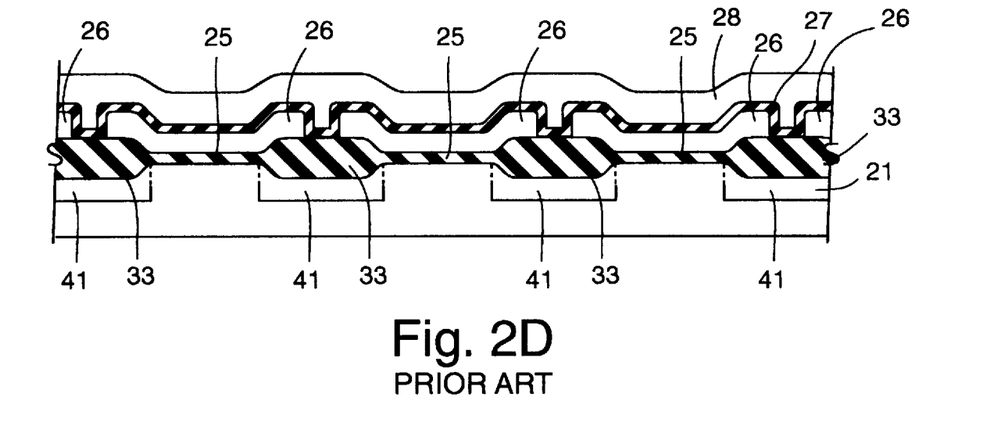
FIG. 2D is a sectional view taken along line 2D–2D' of FIG. 1.
Figure 3:
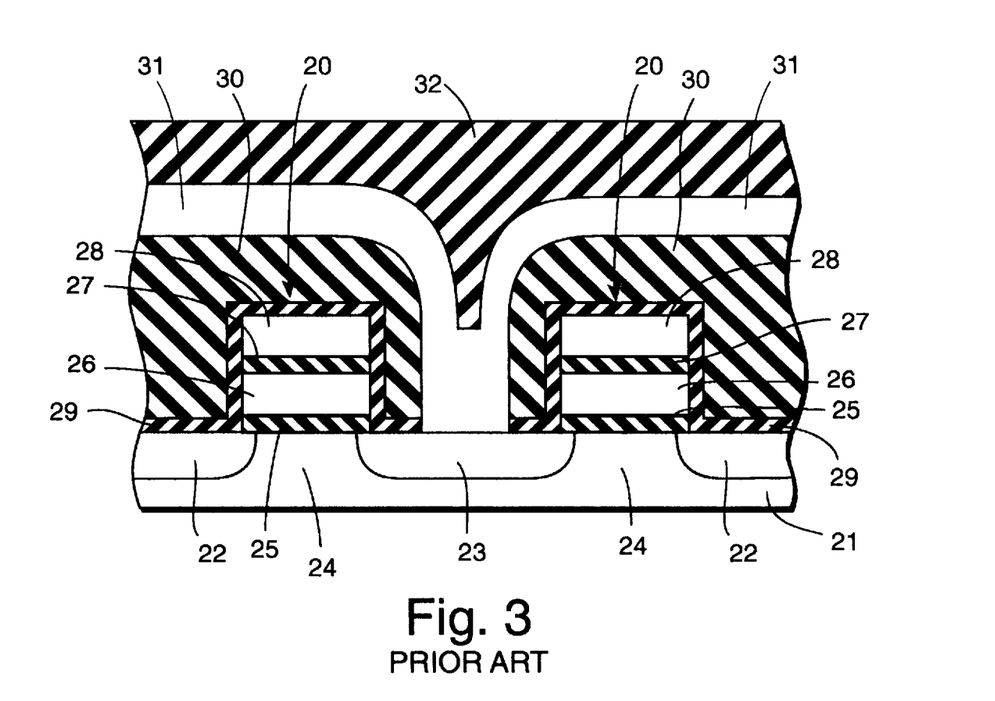
FIG. 3 is a sectional view of a portion of a completed conventional EEPROM.

Electrically erasable programmable read only memories (EEPROMS) are widely known as non-volatile semiconductor memory devices. Such devices may be based on metal-oxide-semiconductor field effect transistors and store bits of information as the presence or absence of electrical charge on floating gates that are located so as to affect the threshold voltage of the MOSFETs. One known type of EEPROM is a batch gate type EEPROM (flash EEPROM) having a two-layered gate structure. The structure of such a memory device will be explained with reference to FIGS. 1–3. FIG. 1 is a plan view of a portion of a conventional flash EEPROM including memory cells arranged in a matrix; FIG. 2A is a sectional view taken along line 2A–2A' of FIG. 1; FIG. 2B is a sectional view taken along line 2B–2B' of FIG. 1; FIG. 2C is a sectional view taken along line 2C–2C' of FIG. 1; and FIG. 2D is sectional view taken along line 2D–2D' of FIG. 1. For clarity, FIGS. 1 and 2 do not show interlayer insulating layers, wiring layers, passivation layers, etc. It will be appreciated that a completed device will include such layers. As best seen in FIG. 2C, the flash EEPROM includes memory cells 20. Each memory cell 20 includes N-type source and drain diffusion regions 22 and 23 formed in a P-type semiconductor substrate 21 to define a channel region 24 therebetween. As can be seen in FIG. 2C, drain diffusion region 23 is shared by adjacent memory cells 20. A floating gate 26 is insulatively spaced from channel region 24 by a first insulating film 25 such as an oxide. A control gate 28 is insulatively spaced from floating gate 26 by a second insulating film 27 such as an oxide. A field oxide film 33 isolates the element regions in which the memory cells are formed from one another. Parasitic channel prevention regions 41 (e.g., P-type diffusion regions) are located under field oxide film 33. See FIGS. 2B and 2D. As noted above, various other layers may be formed to complete the device. For example, with reference to FIG. 3, a thermal oxide film 29 covers the upper and side surfaces of the laminated gate structure and the surface of semiconductor substrate 21. An interlayer insulating film 30 covers the entire surface of thermal oxide film 29. A contact hole through interlayer insulating film 30 and thermal oxide film 29 permits an interconnection layer 31 (e.g., a bit line) to contact drain diffusion region 23. A passivation layer 32 protects the underlying layers.

Data may be written to, read from, and erased from memory cells 20. For example, to erase data from one of the memory cells 20, control gate 28 is applied with, for example, −10V, and source diffusion region 22 is applied with, for example, 5V, to extract electrons from floating gate 26 into source diffusion region 22 by Fowler-Nordheim tunneling. During the erase operation, drain diffusion region 23 is left open.

Figure 4:
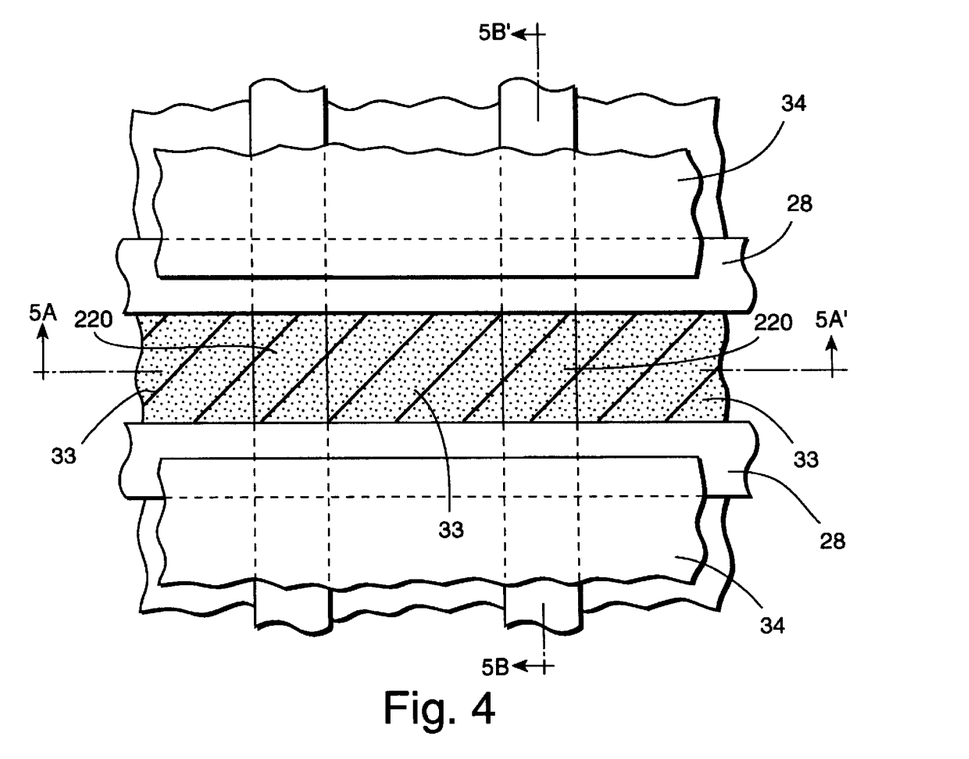
FIG. 4 is a plan view of the EEPROM of FIGS. 1–3 during fabrication.
Figure 5A:
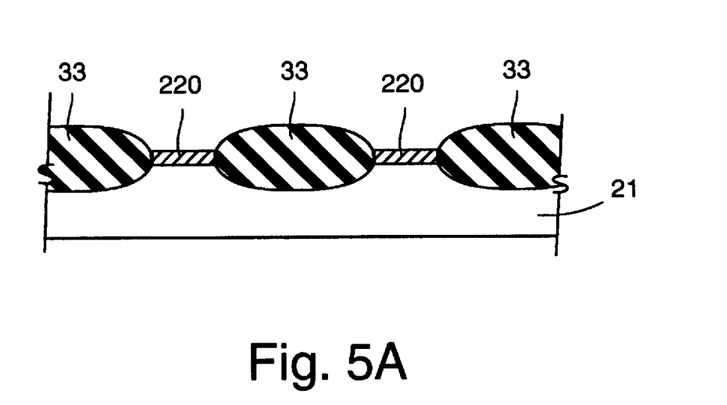
FIG. 5A is a sectional view taken along line 5A–5A' of FIG. 4
Figure 5B:
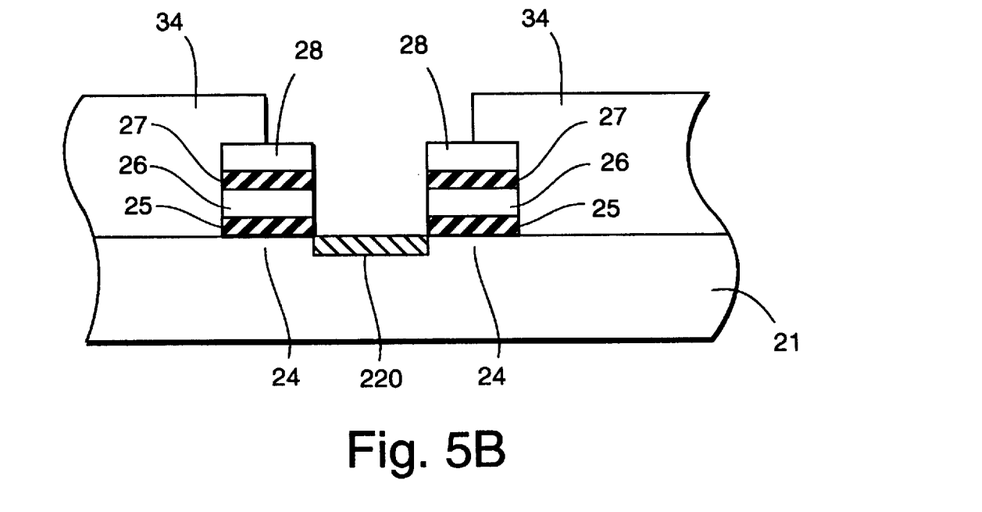
FIG. 5B is a sectional view taken along line 5B–5B' of FIG. 4.

Generally, the source diffusion regions of the flash EEPROM are formed in a self-aligned manner in order to permit the memory cells to be highly integrated. Such self-alignment is generally carried out by implanting the impurities which will form source diffusion regions 22 using control gates 28 as masks. Using this procedure, there is no misalignment between the source diffusion regions and the control gates, and thus the memory cells can be highly integrated. This procedure will be explained in greater detail with reference to FIGS. 4 and 5. FIG. 4 is a plan view during a method for manufacturing the EEPROM prior to removing portions of field oxide film 33 by reactive ion etching in order to implant impurities for forming source diffusion regions 22. FIG. 5A is a sectional view taken along line 5A–5A' of FIG. 4 and FIG. 5B is a sectional view taken along line 5B–5B' of FIG. 4. During manufacturing, field oxide film 33 is formed as a plurality of insulative strips which extend in the vertical direction of FIG. 4. Control gates 28 are subsequently formed to extend in the horizontal direction of FIG. 4. Source formation areas 220 are located in portions of semiconductor substrate 21 between the insulative strips of field oxide film 33. As shown in FIGS. 4 and 5, a resist 34 is patterned using a PEP process to form an opening which extends linearly in the horizontal direction of FIG. 4 and which exposes source formation areas 220 and portions of field insulating film 33 as best seen in FIG. 5A. Thereafter, the exposed portions of field oxide film 33 are removed by reactive ion etching (RIE). Subsequently, an ion implantation is carried out for implanting impurities into the hatched region of FIG. 4. The implanted impurities become the common source region 22 for the memory cells in the adjacent rows of the matrix. However, the etching process for removing the exposed portions of field oxide film 33 can damage source formation areas 220 (which are shown with hatching in FIGS. 5A and 5B). Thus, the subsequent ion implantation for forming the source regions implants ions into these damaged source formation areas. In addition, the damage to the source formation areas may be expanded into the channel regions of the memory cells during subsequent processing, e.g., heating. Such damage degrades the uniformity of the source and channel regions and may adversely impact the device characteristics. Further, since a typical EEPROM cell undergoes many erasing operations in which a voltage is applied to the source regions as described above, uniformity of the source regions is very important for the effective erasing of data. This uniformity, and thus the effectiveness of the erasing operations, may be adversely affected by damage to the source regions caused by etching.

SUMMARY OF THE INVENTION

Accordingly, it is an object of the present invention to provide a semiconductor memory device and a method for manufacturing such a memory device which avoid the problems described above.

In accordance with one aspect of the present invention, a method of manufacturing a semiconductor memory device having a plurality of memory cells arranged in matrix includes forming a first masking layer on a semiconductor substrate of a first conductivity type and patterning the first masking layer to form a plurality of parallel strips which extend in first direction. A second masking layer is formed on the patterned first masking layer and the second masking layer is patterned to form a plurality of parallel strips which extend in a second direction perpendicular to the first direction. First impurities of a second conductivity type are implanted into the semiconductor substrate, using the patterned first and second masking layers as a mask, to form impurity regions of the second conductivity type. The patterned second masking layer is then removed and an insulating film is formed in the spaces between the parallel strips of the patterned first masking layer for isolating element regions on the semiconductor substrate. The insulating film covers the impurity regions of the second conductivity type. The patterned first masking layer is then removed and a conductive layer is patterned to form control gates for the memory cells in the element regions on the semiconductor substrate. Second impurities of the second conductivity type are implanted into the semiconductor substrate using the control gates as a mask to form self-aligned source regions for the memory cells, wherein the source region of a first memory cell is connected to the source region of a second memory cell by one of the impurity regions of the second conductivity type.

According to the method of manufacturing the semiconductor memory device of this invention, the regions for connecting the source diffusion regions is formed prior to forming the insulating film for isolating element regions. Thereafter, the control gate is formed and, with this gate serving as a mask, the ions are implanted into the semiconductor substrate in a self-aligned manner to form the source diffusion regions. The source diffusion regions therefore may be connected to each other without etching the insulating film and thus the source regions are not damaged. A semiconductor memory device exhibiting good characteristics can be thereby obtained.

According to another aspect of the present invention, a semiconductor memory device includes a semiconductor substrate and an insulating layer formed on the semiconductor substrate to isolate element regions on the semiconductor substrate from each other. Memory cells are formed in the element regions. Each memory cell includes source and drain regions formed in the semiconductor substrate to define a channel region therebetween, a charge holding layer, and a control gate. An interconnection region, having the same conductivity type as the source regions, is formed under the insulating layer and connects the source regions of two memory cells which are isolated from one another by the insulating layer.

The semiconductor memory device according to this invention includes a diffusion region serving as a wiring or interconnection layer, which is formed under the insulating layer for isolating elements, to integrally connect the source regions of adjacent memory cells. The integrated source diffusion region may be formed without etching the insulating film.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION

A semiconductor memory device and a method for manufacturing the semiconductor memory device in accordance with the present invention will be described with reference to the drawings.

Figures 6, 7A:
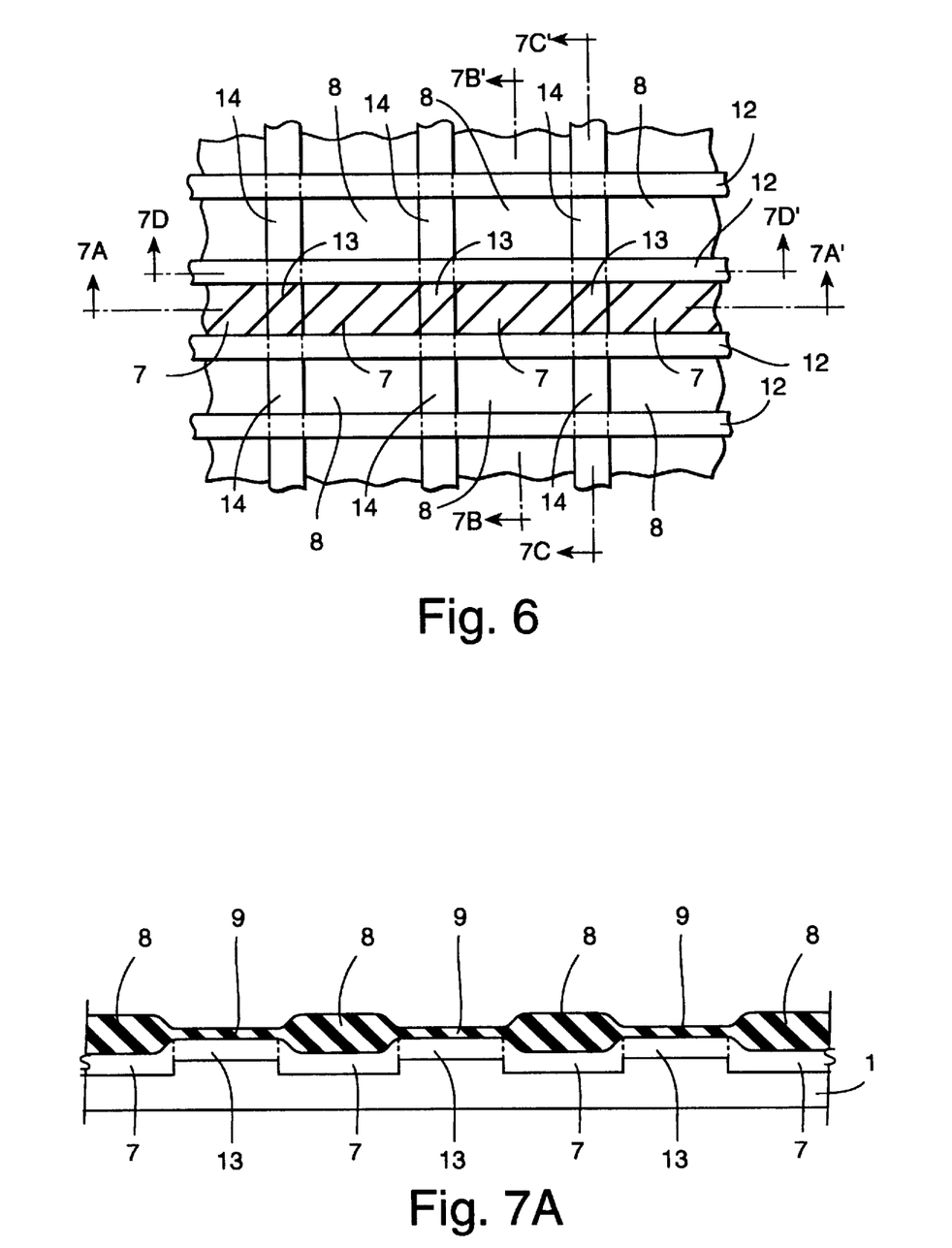
FIG. 6 is a plan view of a portion of an EEPROM in accordance with the present invention.
FIG. 7A is sectional view taken along line 7A–7A' of FIG. 6.
Figure 7B:
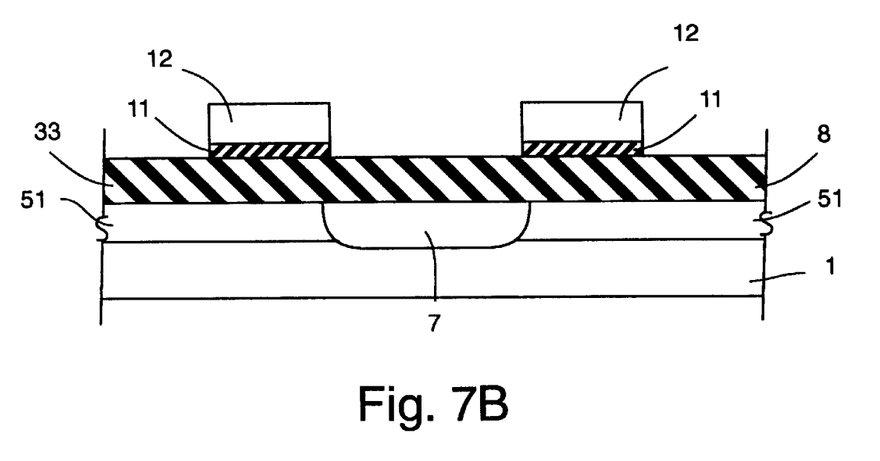
FIG. 7B is a sectional view taken along line 7B–7B' of FIG. 6.
Figure 7C:
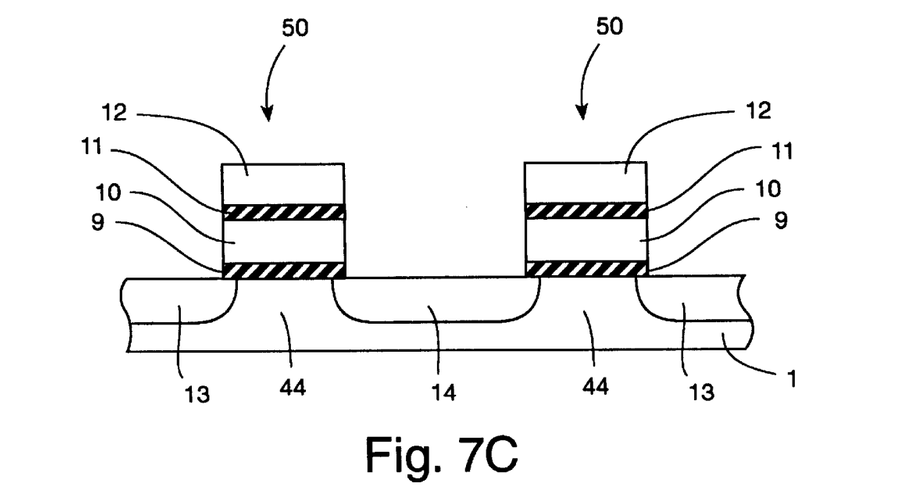
FIG. 7C is a sectional view taken along line 7C–7C' of FIG. 6.
Figure 7D:
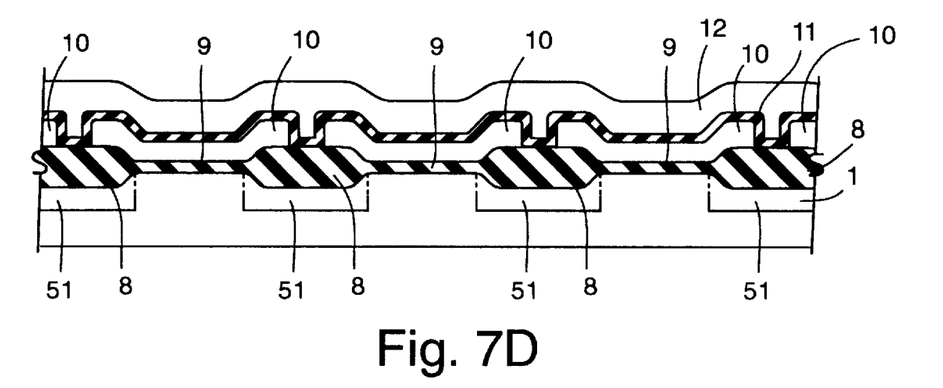
FIG. 7D is a sectional view taken along line 7D–7D' of FIG. 6.

FIG. 6 is a plan view of a portion of an EEPROM in accordance with an embodiment of the present invention; FIG. 7A is a sectional view taken along line 7A–7A' of FIG. 6; FIG. 7B is a sectional view taken along line 7B–7B' of FIG. 6; FIG. 7C is a sectional view taken along line 7C–7C' of FIG. 6; and FIG. 7D is a sectional view taken along line 7D–7D' of FIG. 6. For clarity, FIGS. 6 and 7 do not show interlayer insulating layers, wiring layers, passivation layers, etc. It will be appreciated that a completed device will include such layers. As shown in FIG. 7C, each memory cell 50 includes N-type source and drain diffusion regions 13 and 14 formed in a P-type semiconductor substrate 1 to define a channel region 44 therebetween. A floating gate 10 is insulatively spaced from channel region 44 by a first insulating film 9 such as an oxide. A control gate 12 is insulatively spaced from floating gate 10 by a second insulating film 11 such as an oxide. As noted above, various other layers may be formed to complete the device. For example, with reference to FIG. 8, a thermal oxide film 19 covers the upper and side surfaces of the laminated gate structure and the surface of semiconductor substrate 1. An interlayer insulating film 60 covers the entire surface of thermal oxide film 19. A contact hole through interlayer insulating film 60 and thermal oxide film 19 permits an interconnection layer 61 (e.g., a bit line) to contact drain diffusion region 14. A passivation layer 62 protects the underlying layers.

As can be seen with reference to FIG. 7A, source diffusion regions 13 are connected to each other by diffusion regions 7 which are formed under field oxide film 8 and which function as interconnection regions. Source diffusion regions 13 and interconnection diffusion regions 7 constitute an integrated source diffusion region.

Figure 9A:
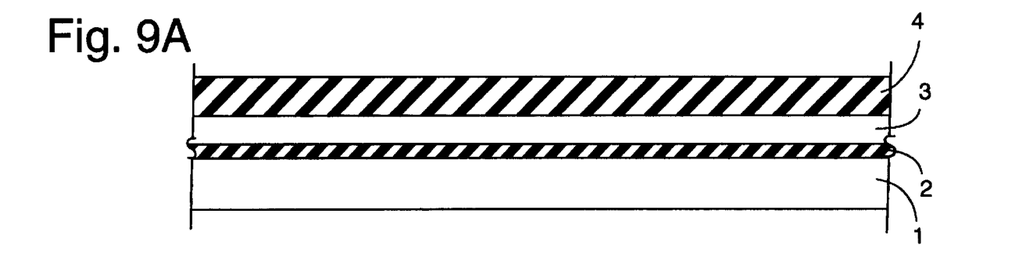
FIGS. 9A–9E are sectional views showing a method of manufacturing an EEPROM in accordance with the present invention.

A method of manufacturing such a semiconductor memory device will now be described with reference to FIGS. 9A–9E. To start with, as illustrated in FIG. 9A, to form a LOCOS (local oxidation of silicon) structure, an oxide film 2 is formed by thermal oxidation on the surface of semiconductor substrate 1. Next, a polysilicon layer 3 and a silicon nitride (SiN) layer 4 are formed, for example, by a CVD method. Polysilicon layer 3 and silicon nitride layer 4 constitute a first masking layer. It will be appreciated that layers of other materials may be used as the first masking layer and the invention is not limited in this respect.

Figure 9B:
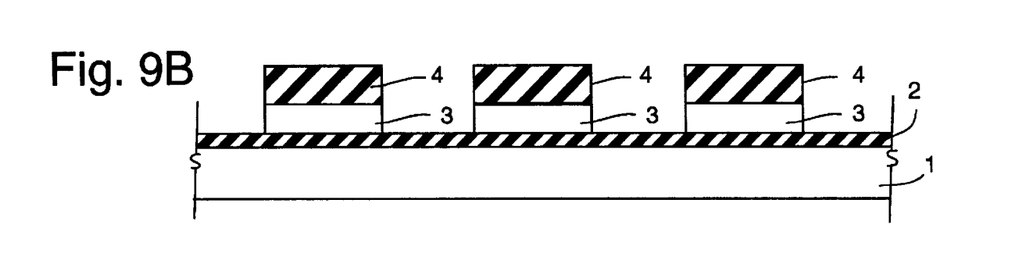
Figure 10:
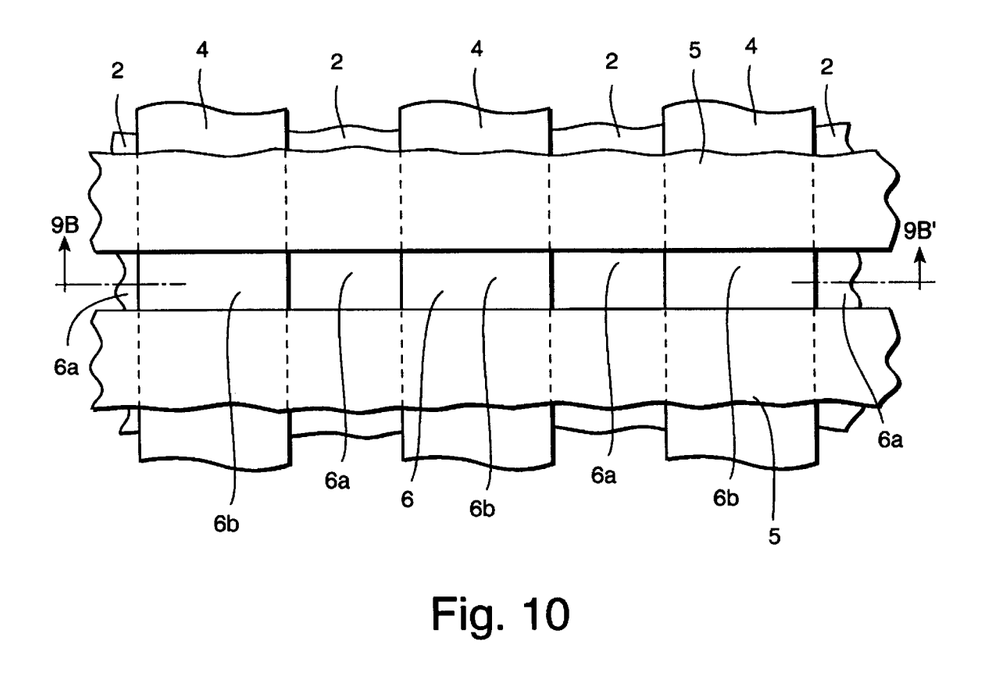
FIG. 10 is a plan view showing an arrangement of masking layers used in the manufacturing of an EEPROM in accordance with the present invention.

Next, as shown in FIG. 9B, polysilicon layer 3 and silicon nitride layer 4 are patterned to expose oxide film 2 in regions where the field oxide film will be formed. As best illustrated in the plan view of FIG. 10, layers 3 and 4 are patterned to leave strips which extend in a vertical direction. A resist 5 is then coated on the surfaces of oxide film 2 and silicon nitride layer 4. Resist 5 constitutes a second masking layer. Again, it will be appreciated that the present invention is not limited to the use of a resist as the second masking layer. Resist 5 is patterned to leave strips which extend in a horizontal direction as shown in FIG. 10. The patterned masking layers define a linear region 6 which includes regions 6a and 6b as shown in FIG. 10. Regions 6a are regions in which diffusion regions 7 functioning as interconnections will be formed and regions 6b are regions in which source diffusion regions 13 of the memory cells will be formed. As will be discussed below, after impurities for the diffusion regions 7 are implanted, the patterned resist 5 will be removed and a field oxide film will be formed in the spaces between the strips of the first patterned masking layer, thereby covering the regions 6a. FIG. 9B is a sectional view taken along the line 9B–9B' FIG. 10.

Figure 9C:
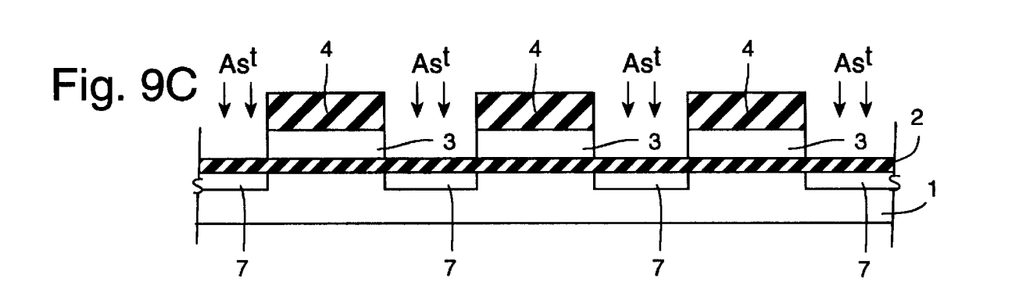

As illustrated in FIG. 9C, N-type impurities such arsenic are implanted into regions 6a through oxide film 2, thereby forming diffusion regions 7. These diffusion regions 7 become $N^+$-type diffusion regions which function as interconnections as described above. The dose of the arsenic ions is on the order of $1\times10^{15}$ to $3\times10^{15}$ $cm^{-2}$ and the implantation energy is on the order of 50–60 KeV. Arsenic ions have a lower resistance than other N-type ions. The patterned resist and the patterned polysilicon layer 3-silicon nitride layer 4 function as ion implantation masks when the arsenic ions are implanted.

Figure 11:
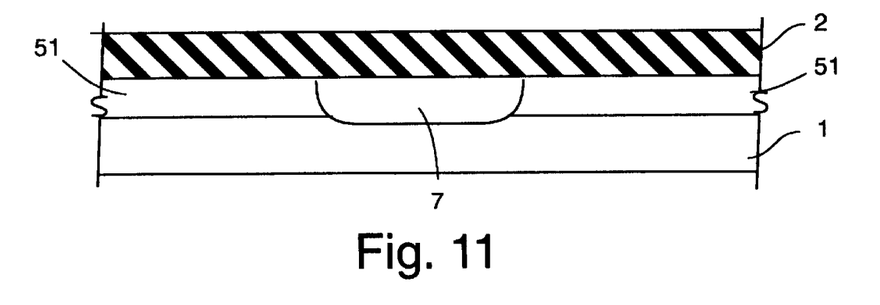
FIG. 11 is another sectional view showing a step in the method of manufacturing an EEPROM in accordance with the invention.

Next, the patterned resist 5 is removed and P-type impurities are implanted into oxide film 2 using the first masking layer (i.e., the patterned polysilicon layer 3 and silicon nitride layer 4) as a mask, thereby forming parasitic channel prevention regions 51 (shown in FIGS. 7B and 7D). Amorphous silicon can be also used as a mask. FIG. 11 is a sectional view of this manufacturing step taken in the same direction as the view along line 7B–7B' of FIG. 6.

Figure 9D:
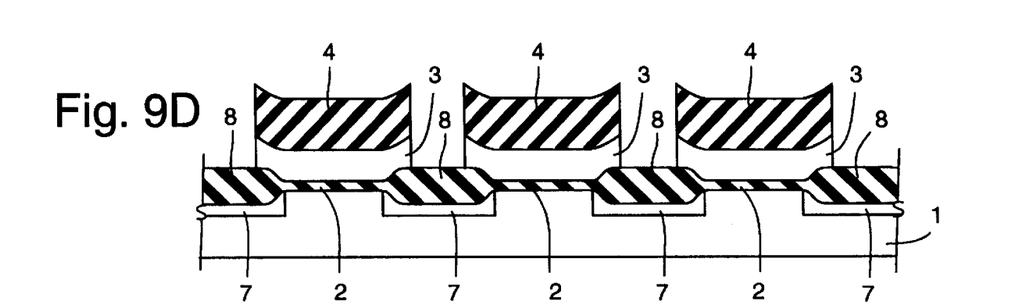

Thereafter, as depicted in FIG. 9D, heating is effected in an oxygen atmosphere, e.g. at a temperature of 1000° C., thereby forming field oxide films 8 on diffusion regions 7. The thickness of field oxide film 8 is about 600 nm to 850 nm.

Figure 9E:
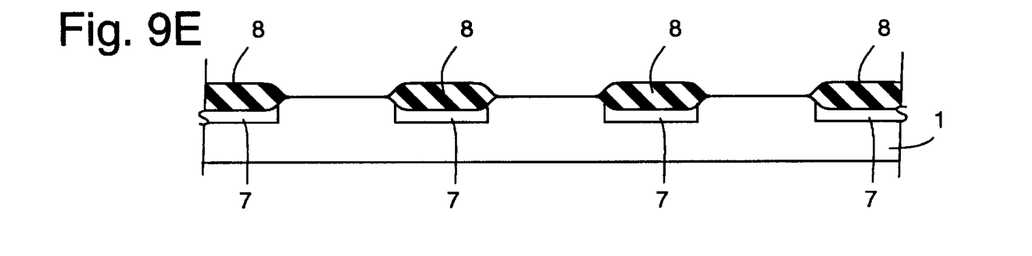

As illustrated in FIG. 9E, after forming field oxide film 8, silicon nitride layer 4, polysilicon layer 3 and oxide film 2 are removed by etching, thus exposing a cell forming area. Thus, in accordance with the manufacturing method which has been described herein, the diffusion regions 7 are formed without etching the field oxide film.

Figure 8:
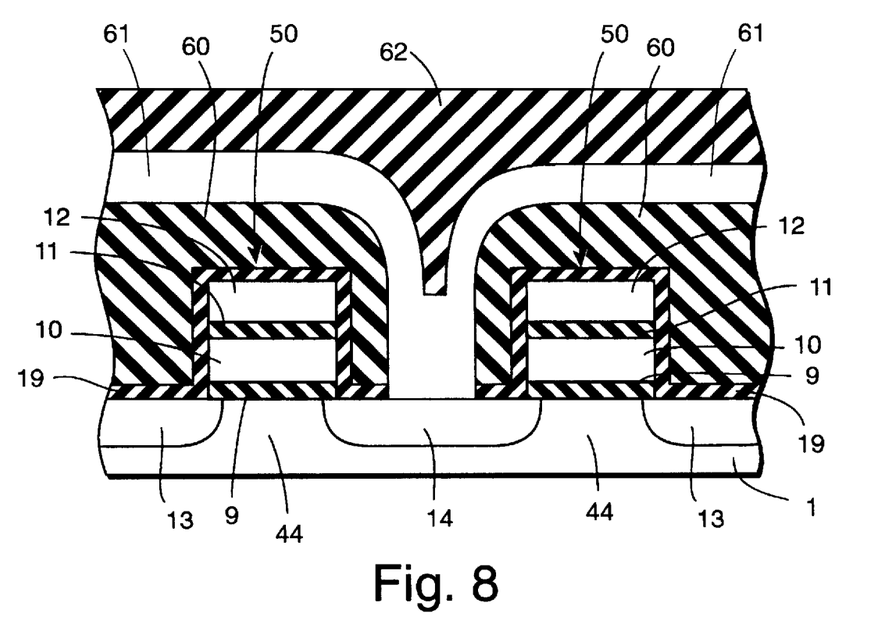
FIG. 8 is a sectional view of a portion of a completed EEPROM in accordance with the present invention.

With reference to FIGS. 7B, 7C, and 7D, first gate oxide film 9, floating gate 10, second oxide film 11 and control gate 12 are formed by conventional processes. For example, a first insulating layer, a first conductive layer (e.g., polysilicon), a second insulating layer, and a second conductive layer (e.g., polysilicon) may be formed in sequence and then patterned to form the laminated gate structure. After this processing, an ion implantation of N-type impurities such as arsenic is performed in a self-aligned manner with control gate 12 serving as an ion implantation mask to form source diffusion regions 13. The implantation of N-type impurities for forming drain diffusion regions 14 may be carried in the same implantation for forming the source diffusion regions or in a different implantation. The thus formed source diffusion regions 13 are integrally joined to the previously formed interconnection diffusion regions 7. Thermal oxide film 19 is then formed to cover an upper surface of the gate structure and the semiconductor substrate, and interlayer insulating film 60 is formed over the entire surface as shown in FIG. 8.

Hereinafter, known processes, such as forming electrodes, interconnections, and depositing a passivation film are performed, thereby completely constructing the semiconductor memory device. With reference to FIG. 7C, the distance between the neighboring control gates 12 on the source side of the control gate is 1.7 $\mu$m (micrometers) and the distance between the neighboring control gates 12 on the drain side of the control gate is 0.7 $\mu$m (micrometers). Thus, in a batch erase type EEPROM (Flash EEPROM) manufactured in accordance with the above-described method, memory cells 50 such as illustrated in FIG. 8 are constructed. That is, a channel region 44 is formed between a drain diffusion region 14 and a source diffusion region 13 which are formed on the surface of semiconductor substrate 1. Floating gate 10 is formed above this channel region 44 through first gate oxide film 9. Control gate 12 is formed above floating gate 10 through second gate oxide film 11. A thermal oxide film 19 covers an upper and side surface of the laminated gate structure and interlayer insulating film 30 is formed over the entire surface. Contact holes are formed in the inter-layer insulating film 60 to expose drain diffusion regions 23. Then wiring (interconnection) materials (e.g., bit lines) are deposited therein, thus forming interconnection layer 61. A passivation film 62 is deposited on and above this interconnection layer 61.

In accordance with the embodiment of the present invention, the diffusion regions for connecting the source diffusion regions of the memory cells are formed before the field oxide film is formed. Thus, the integrated source diffused region can be formed without etching the field oxide film as is required in the prior art. It is therefore possible to prevent deterioration of memory cell characteristics due to damage to the source regions caused by such etching. That is, in the semiconductor memory device according to this invention, the diffusion region is formed under the field oxide film, and, thus, there is no need to etch the field oxide film in order to form the integrated source diffusion region. For this reason, adverse effects on the memory cell characteristics due to etching can be avoided. Accordingly, for example, if high voltage is applied to the integrated source region during an erasing operation, cracking of the substrate is prevented.

Thus, according to the method of manufacturing the semiconductor memory device of the present invention, the diffusion regions for connecting the source diffusion regions are formed before forming the insulating film, and hence, it is not required that an insulating film etch which may damage the source diffusion regions be conducted to form the integrated source diffusion layer. A semiconductor memory device exhibiting the good characteristics can be thereby obtained.

It is apparent that, in this invention, a wide range of different working modes can be formed based on the invention without deviating from the spirit and scope of the invention. This invention is not restricted by the specific details described above and is limited only by the appended claims.

I claim:

1. A method of manufacturing a semiconductor memory device having a plurality of memory cells arranged in a matrix, the method comprising the steps of:

forming a first masking layer on a semiconductor substrate of a first conductivity type;

patterning said first masking layer to form a plurality of parallel strips which extend in a first direction;

forming a second masking layer on said patterned first masking layer;

patterning said second masking layer to form a plurality of parallel strips which extend in a second direction perpendicular to the first direction;

implanting first impurities of a second conductivity type into said semiconductor substrate, using the patterned first and second masking layers as a mask, to form impurity regions of the second conductivity type;

removing the patterned second masking layer;

forming an insulating film on portions of said semiconductor substrate exposed in the spaces between the parallel strips of the patterned first masking layer so as to form isolated element regions on said semiconductor substrate, said insulating film covering said impurity regions of the second conductivity type;

removing the first patterned masking layer;

patterning a conductive layer to form control gates for said memory cells in the element regions on said semiconductor substrate; and implanting second impurities of the second conductivity type into said semiconductor substrate using said control gates as a mask to form self-aligned source regions for said memory cells, wherein the source region of a first memory cell is connected to the source region of a second memory cell by one of said impurity regions of the second conductivity type.

2. The method of manufacturing a semiconductor memory device according to claim 1, wherein the first impurities of the second conductivity type are arsenic.

3. The method of manufacturing a semiconductor memory device according to claim 1, wherein the second impurities of the second conductivity type are arsenic.

4. The method of manufacturing a semiconductor memory device according to claim 1, wherein said first masking layer comprises a first layer of polysilicon and a second layer of silicon nitride.

5. The method of manufacturing a semiconductor memory device according to claim 1, wherein said second masking layer comprises a resist.

6. The method of manufacturing a semiconductor memory device according to claim 1, further comprising a step of:

implanting third impurities of the second conductivity type into said semiconductor substrate to form drain regions for said memory cells.

* * * * *